United States Patent [19]

Mukai et al.

[11] Patent Number: 5,719,106
[45] Date of Patent: Feb. 17, 1998

[54] METHOD OF HEAT TREATING OXIDE SUPERCONDUCTING WIRE

[75] Inventors: Hidehito Mukai; Nobuhiro Shibuta, both of Osaka, Japan

[73] Assignee: Sumitomo Electric Industries, Ltd.

[21] Appl. No.: 203,843

[22] Filed: Feb. 28, 1994

Related U.S. Application Data

[63] Continuation of Ser. No. 854,130, Mar. 19, 1992, abandoned.

[30] Foreign Application Priority Data

Mar. 20, 1991 [JP] Japan ................. 3-056684

[51] Int. Cl.$^6$ ................................. H01L 39/24
[52] U.S. Cl. ................. 505/430; 505/433; 505/742; 148/96
[58] Field of Search ................. 148/96; 505/430, 505/431, 433, 742

[56] References Cited

U.S. PATENT DOCUMENTS

| 5,017,552 | 5/1991 | Porcell ................. 29/599 |
| 5,045,527 | 9/1991 | Ikeno et al. ................. 505/740 |
| 5,164,361 | 11/1992 | Aprigliano et al. ................. 505/431 |
| 5,426,093 | 6/1995 | Yokota et al. ................. 505/430 |

FOREIGN PATENT DOCUMENTS

| 0 299 788 | 1/1989 | European Pat. Off. . |
| 3803285 | 8/1989 | Germany ................. 505/739 |

*Primary Examiner*—George Wyszomierski
*Attorney, Agent, or Firm*—Pennie & Edmonds LLP

[57] ABSTRACT

A holder (1) provided with a spirally extending groove (2) is prepared and an oxide superconducting wire (3) is arranged in the groove (2) to be heat treated, so that each portion thereof is not bonded to another portion during the heat treatment.

6 Claims, 1 Drawing Sheet

METHOD OF HEAT TREATING OXIDE SUPERCONDUCTING WIRE

This is a continuation of application Ser. No. 07/854,130, filed Mar. 19, 1992, now abandoned.

BACKGROUND OF THE INVENTION

1. Field of the Invention

The present invention relates to a method of heat treatment which is carried out for sintering a superconductive material contained in an oxide superconducting wire.

2. Background of the Invention

A typical oxide superconducting wire is obtained by filling up a metal sheath with raw material powder for an oxide superconductive material, and heat treating the same for sintering the raw material powder.

In order to obtain such an oxide superconducting wire, heat treatment is carried out as described above, while a plurality of long oxide superconducting wires must be bundled when the same are heat treated in a batch system, in order to efficiently carry out the heat treatment. In this case, the oxide superconducting wires may undesirably be bonded to each other as the result of the heat treatment.

In order to prevent such bonding, bone ash has generally been applied to each oxide superconducting wire, to carry out heat treatment thereof along steps of drying, bundling, heat treatment (sintering) and removal of the bone ash.

However, the conventional method of heat treating an oxide superconducting wire has a number of steps as described above, and takes much time.

When a tape-type oxide superconducting wire is heat treated, further, the same may be bonded to another oxide superconducting wire at its edge portion in spite of bone ash which is applied thereto.

SUMMARY OF THE INVENTION

Accordingly, an object of the present invention is to provide a method of heat treating an oxide superconducting wire, which can solve the aforementioned problems.

In order to solve the aforementioned problems, a holder which is provided with a spirally extending groove is employed in the present invention. An oxide superconducting wire to be heat treated is arranged in the groove of the holder, and heat treated in this state.

According to the present invention, the oxide superconducting wire to be heat treated is arranged in the groove, whereby it is possible to prevent each portion of the oxide superconducting wire from being bonded to another portion.

Thus, according to the present invention, it is possible to omit steps of applying bone ash for preventing bonding and removing the same, whereby the process for the heat treatment can be simplified.

Further, the oxide superconducting wire arranged in the groove can be uniformly heat treated since no specific portion thereof is in contact with another portion, whereby the heat treated oxide superconducting wire can provide uniform characteristics. Thus, the present invention is particularly effective when the same is employed in a field which requires a long oxide superconducting wire such as a bus bar, a magnet, a cable or the like.

In addition, the oxide superconducting wire can freely move in the groove with respect to thermal expansion and contraction thereof during the heat treatment, whereby no undesired stress is applied to the oxide superconducting wire, which can be prevented from undesirable deformation. Therefore, the heat treated oxide superconducting wire can provide uniform characteristics. Further, it is possible to prevent partial reduction of the characteristics after delivery of the wire, since the same is prevented from undesirable deformation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
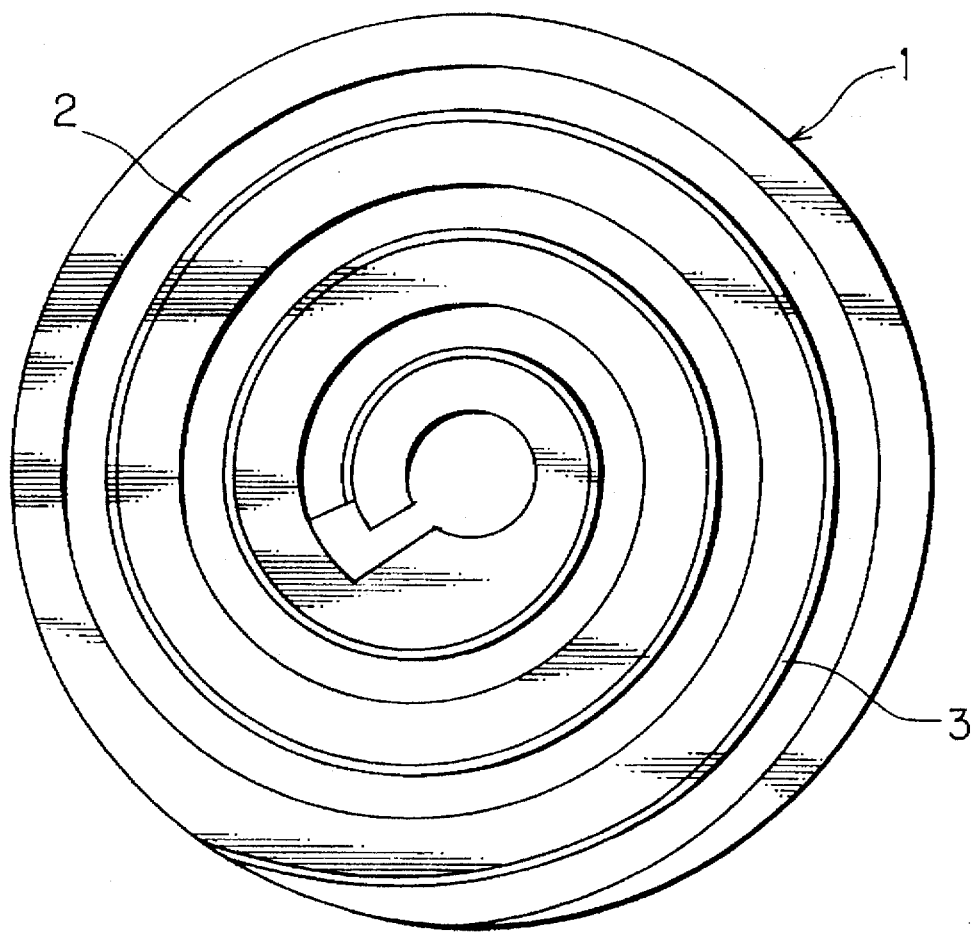
FIG. 1 is a plan view showing a holder 1 which is employed in an embodiment of the present invention.
Figure 2:
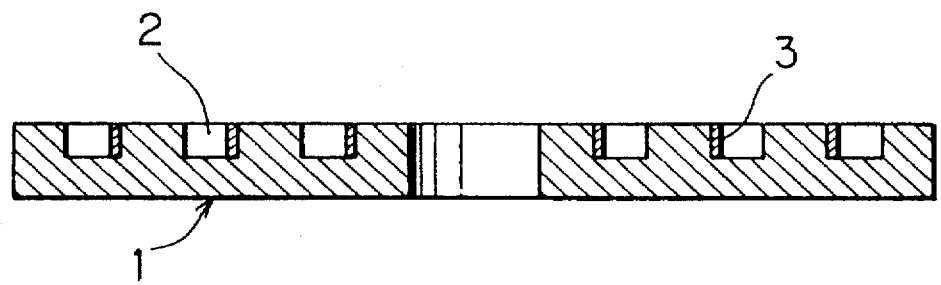
FIG. 2 is a sectional view of the holder 1 shown in FIG. 1.

Referring to FIGS. 1 and 2, a holder 1 is provided with a spirally extending groove 2. An oxide superconducting wire 3 is arranged in this groove 2. This oxide superconducting wire 3 is obtained by filling up a metal sheath with an oxide superconductive material and flattening the same into the form of a tape, for example. While the oxide superconducting wire 3 is arranged along the inner side of the groove 2 in this embodiment, the state of such arrangement depends on the thermal expansion coefficients of the material for the holder 1 and the oxide superconducting wire 3. When the former is larger in thermal expansion coefficient than the latter, the oxide superconducting wire 3 is arranged along the inner side of the groove 2. If the holder 1 is made of stainless steel, for example, the oxide sueprconducting wire 3 is arranged along the inner side of the groove 2.

The holder 1 is made of a material which withstands the temperature and atmosphere for heat treatment of the oxide superconducting wire 3. For example, stainless steel is advantageously employed as a material for the holder 1.

In order to heat treat an oxide superconducting wire which is larger in length than the groove 2 provided in a single holder 1, a plurality of such holders 1 are employed. In this case, such a plurality of holders 1 are stacked with each other while the innermost and outermost turns of the groove 2 of each holder 1 are preferably partially hollowed out, so that the oxide superconducting wire can pass through adjacent ones of the holders 1.

Example carried out according to the present invention is now described.

Oxides or carbonates were so mixed that Bi, Pb, Sr, Ca and Cu contained therein were in composition ratios of 1.80:0.41:2.01:2.18:3.02, and the mixture was heat treated to prepare powder mainly consisting of 2212 phases, containing (Bi+Pb), Sr, Ca and Cu substantially in composition ratios of 2:2:1:2, and non-superconducting phases. This powder was degassed in a decompressed atmosphere of 6 Torr at 760° C. for 3 hours.

The as-obtained powder was covered with a silver pipe of 12 mm in outer diameter and 8 mm in inner diameter, drawn into 1 mm in outer diameter, and then rolled into 0.18 mm in thickness and 4 mm in width. On the other hand, a doughnut-type holder of 1000 mm in outer diameter, 450 mm in inner diameter and 8 mm in thickness was prepared from SUS304(stainless steel) with a spiral groove of 5 mm in width and 5 mm in depth at intervals of 8 mm (center distance between respective portions of the groove). In this holder, the innermost and outermost turns of the groove were hollowed out by ¼ respectively. The tape-type oxide superconducting wire of 75 m in length, which was obtained in the aforementioned manner, was arranged in an upright state along the inner side of the groove provided in the holder, and heat treated at 845° C. for 50 hours in this state, whereby no portions of the wire were bonded to each other. This wire was separated from inner and outer walls of the groove and prevented from undesirable deformation. Then, the oxide superconducting wire was taken out from the groove and rolled into 0.15 mm in thickness. Thereafter this oxide superconducting wire was again arranged in the groove of the holder similarly to the above, and again heat treated at 840° C. for 50 hours in this state.

The as-obtained oxide superconducting wire was immersed in liquid nitrogen, and subjected to measurement of critical current densities across the turns and along its overall length. The average critical current density across the turns was $2 \times 10^4$ A/cm$^2$ with standard deviation of 2%, whereby it was recognized that uniform characteristics were attained. The critical current density along the overall length was also excellent with a value of $2 \times 10^4$ A/cm$^2$.

Then, two holders were prepared to allow passage of an oxide superconducting wire through innermost and outermost turns of grooves provided therein respectively, and processed in a similar manner to the above. As the result, the critical current density at the passed portion was $2 \times 10^4$ A/cm$^2$, with a characteristic identical to that of a general portion.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of heat treating an oxide superconducting wire, said method comprising the steps of:

preparing a plane holder being provided with a spiral shaped groove thereon;

arranging an oxide superconducting wire along the inner side of said groove, wherein said oxide superconducting wire comprises an oxide superconducting material encased in a sheath;

heat treating said oxide superconducting wire while said wire is arranged in said groove, wherein said oxide superconducting wire can move in said groove with respect to thermal expansion and contraction thereof during said heat treatment; and removing said heat treated oxide superconducting wire from said groove.

2. A method of heat treating an oxide superconducting wire in accordance with claim 1, wherein said holder is made of stainless steel.

3. A method of heat treating an oxide superconducting wire in accordance with claim 1, wherein said groove is of a depth such that said oxide superconducting wire does not extend beyond surface plane of said holder when said oxide superconducting wire is arranged in said groove.

4. A method of heat treating an oxide superconducting wire in accordance with claim 3, wherein arranging step comprises flattening said oxide superconducting wire to produce a flattened wire having a tape-shaped cross section and orienting said flattened wire in said groove such that the longer cross-sectional dimension of said tape-shaped oxide superconducting wire extends perpendicular from floor of said groove.

5. A method of heat treating an oxide superconducting wire in accordance with claim 1, wherein a plurality of holders with spiral shaped grooves are prepared in said step of preparing a holder, and said arranging step comprises arranging said oxide superconducting wire in said plurality of holders.

6. A method of heat treating an oxide superconducting wire in accordance with claim 5, further comprising a step of stacking said plurality of holders prior to said step of heat treating.

* * * * *